United States Patent [19]

Soar

[11] Patent Number: 4,838,802
[45] Date of Patent: Jun. 13, 1989

[54] LOW INDUCTANCE GROUND LEAD

[75] Inventor: Steven E. Soar, Vancouver, Wash.

[73] Assignee: Tektronix, Inc., Beaverton, Oreg.

[21] Appl. No.: 222,353

[22] Filed: Jul. 20, 1988

Related U.S. Application Data

[63] Continuation of Ser. No. 71,130, Jul. 8, 1987, abandoned.

[51] Int. Cl.$^4$ .............................................. H01R 4/66
[52] U.S. Cl. .................................... 439/98; 439/92; 439/502
[58] Field of Search ............... 439/92, 98, 99, 108, 439/492, 502, 505, 506

[56] References Cited

U.S. PATENT DOCUMENTS

| | | | |
|---|---|---|---|
| 411,093 | 9/1889 | Coughlin | 439/502 |
| 3,197,729 | 7/1965 | Sarazen | 439/492 |
| 3,543,216 | 11/1970 | Vanderbeek | 439/502 |
| 3,997,229 | 12/1976 | Narozny et al. | 439/492 |

FOREIGN PATENT DOCUMENTS 2040113  8/1980  United Kingdom ................. 439/98

OTHER PUBLICATIONS

Malco "Flat Cable Connectors", Bulletin 705, 1970.
AMP "Flexible Flat Cable Connectors", Cat. No. 73-151, Rev. 1-76.
Electronic Engineering Equipment, Jun. 1958, pp. 49 and 50.

*Primary Examiner*—Gary F. Paumen
*Attorney, Agent, or Firm*—John D. Winkelman; William A. Birdwell; Peter J. Meza

[57] ABSTRACT

A low inductance ground lead for grounding a signal probe used in high frequency measurement to a ground probe. A ground lead comprises a single flexible strand or multiple strands which are substantially untwisted with respect to one another. Preferably, the strands have a rectangular cross-section and a relatively large surface area for a given cross-sectional area. Substantially noninductive connections for connecting one end of said ground lead to the signal probe and the other end of said ground lead to the ground probe are provided, so as to bypass the self-inductance of the signal probe and the ground probe.

4 Claims, 1 Drawing Sheet

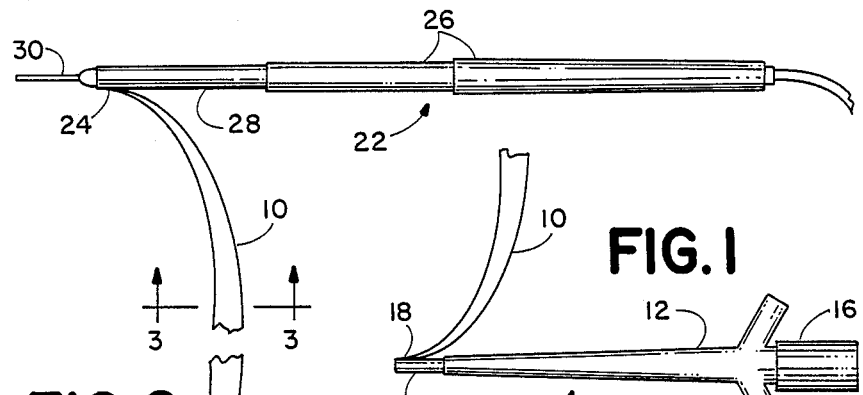
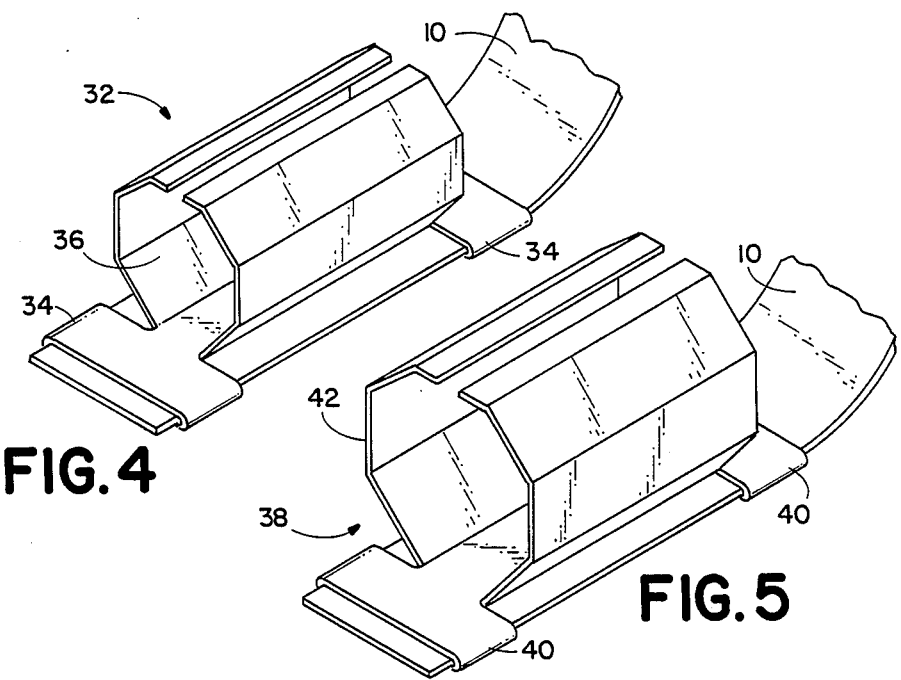

LOW INDUCTANCE GROUND LEAD

This is a continuation of application Ser. No. 07/071,130 filed July 8, 1987 and now abandoned.

BACKGROUND OF THE INVENTION

This invention relates to a low inductance ground lead for grounding a signal probe used in high frequency measurements.

A common problem in the measurement of high frequency signals is that the self-inductance of the ground connection to the signal probe combines with the input capacitance of the signal probe to form a series resonant circuit that not only reduces the amplitude of the input signal with increasing frequency, but produces ringing. This increasingly degrades the accuracy of the measurement system with increasing signal frequency. Typically, the ground connection to a signal probe comprises a ground lead made of braided wire, and a ground probe to which the ground lead is connected, both of which have relatively high self-inductances.

The accuracy of high frequency measurements (on the order of 100 megahertz and higher) becomes compromised as signal frequencies approach the frequency of the series-resonant circuit formed by the inductance in the signal path and the input capacitance of the signal probe. The resonant frequency f of such a circuit is determined by the following equation:

$$f = \frac{1}{2\pi \sqrt{LC}}$$

where L is the inductance of the signal path and C is the capacitance of the signal probe.

The capacitance of typical signal probes in use for high frequency measurements is on the order of 10–15 picofarads. The self-inductance of the signal probe from the signal source to the point of contact with the ground lead, the inductance of the ground lead, and the self-inductance of the ground probe (which is the means of completing the circuit to ground) from the point of contact with the ground lead to ground all contribute to the inductance of the signal path. However, the inductance of the ground lead is the primary contributor to the total inductance in the signal path.

The inductance of conventional ground leads is on the order of 200–300 nanohenries. Given typical signal probe capacitances, the frequency of the series-resonant circuit begins to degradce high frequency measurements as signal frequencies exceed 100 megahertz. The degree of degradation increases as the frequency of the signal increases.

The previous steps taken to alleviate this problem of degrading accuracy have included reducing the self-inductance of the ground connection by reducing the length of the ground lead, using as a ground lead a conductor having a large circular cross-section, and eliminating the ground probe and instead contacting ground directly with the ground lead. However, these steps produce the disadvantage of making the probe inconvenient to use. The limited reach of such a ground lead often makes it difficult to connect to an available ground. A lead with a large circular cross-section is relatively inflexible, which makes it difficult to connect to, and keep in contact with ground. Moreover, frequent bending of such a lead results in early breakage due to work hardening of the metal. And, elimination of the ground probe makes the ground lead difficult to manipulate and continuity of the ground connection difficult to maintain.

Another approach to alleviating the aforementioned problem of ground probe self-inductance has been to connect a short wire to the ground of the signal probe by wrapping one end of the wire around the signal probe near its tip and holding the other end of the wire in contact with ground. While this solution avoids the self-inductance of the signal probe, it does not permit use of a significantly longer ground lead.

Accordingly, there is a need for an improved grounding connection for use with high frequency signal probes that reduces ground connection self-inductance and resultant signal degradation, while permitting convenient and assured, continuous ground.

SUMMARY OF THE INVENTION

The present invention solves the problem of degraded accuracy in high frequency measurements by reducing the inductance of the material of which the ground lead is composed while retaining flexibility of the ground lead, and by the method of connecting the ground lead to ground so as not to introduce significant additional inductance while avoiding the self-inductance of the ground probe. The invention extends the reach of the ground lead and the usefulness of the signal probe and measurement system.

By decreasing the self-inductance of the signal path, the invention increases the frequency of the series-resonant circuit, thereby allowing accurate measurement of higher frequency signals than would otherwise be possible with a given signal probe and a ground lead of given length.

The self-inductance of the signal path is reduced without reducing the length of the ground lead by using a single strand of conductive material of relatively large surface area for a given cross-sectional area. Inductance in the ground lead caused by the coiling or twisting of strands with respect to each other, such as in the multi-strand braided wire ground leads presently in use, thereby is eliminated.

Even though a single strand, the ground lead of the present invention is flexible. That is, it can form a loop over its length and be returned to its original shape without adding to the brittleness of the strand or without significantly increasing the likelihood that it will break or be unable to return to its original shape after repeatedly making such loops. Flexibility is achieved primarily by employing a geometry that accommodates frequent bending in at least one dimension without producing significant work hardening. Preferably, this is accomplished by using a relatively flat ground lead having a substantially rectangular cross-section.

The invention further reduces the inductance of the signal path by connecting the ground lead near the tip of the ground probe thereby bypassing the self-inductance of the ground probe. Noninductive connection of the ground lead to one end of the signal probe so as to bypass the self-inductance of the signal probe is also employed in an embodiment of the invention.

Therefore, it is a principal objective of the present invention to provide a new and improved ground lead for a high frequency signal probe that reduces degradation of measurement accuracy as the frequency of the measured signal increases.

It is another objective of the present invention to provide a novel ground lead with reduced self-inductance for a given length.

It is a further objective of the present invention to provide a novel low inductance means for connecting a ground lead to a probe.

The foregoing and other objectives, features, and advantages of the invention will be more readily understood upon consideration of the following detailed description of the invention, taken in conjunction with the accompanying drawings.

BRIEF DESCRIPTION OF THE DRAWINGS

FIG. 1 is an overall view of a ground lead according to the present invention, with one end of the ground lead connected to a ground probe and the other end cut away.

FIG. 2 is an overall view of a ground lead according to the present invention, connected to both a ground probe and a signal probe.

FIG. 3 shows a cross-section, taken along line 3—3 in FIG. 2, of the strand part of a ground lead according to the present invention.

FIG. 4 shows a preferred embodiment of a connecting means for connecting a ground lead strand according to the present invention to a ground probe.

FIG. 5 shows a preferred embodiment of a connecting means for connecting a ground lead strand according to the present invention to a signal probe.

DESCRIPTION OF THE PREFERRED EMBODIMENT

Referring first to FIG. 1, a ground lead according to the present invention, comprising a single strand 10 of flexible copper material having a substantially rectangular cross-section, is shown connected to a ground probe 20. The ground probe may be any means for grounding the signal probe through the ground lead. Typically, it comprises a grabber having an insulated handle 12, a metal tip 14 containing some gripping wires (not shown), and a pushbutton 16 for operating the gripping wires, which allows convenient connection and disconnection of the ground path circuit. However, the invention envisions that the ground lead could be connected to any other source of ground, though the connection should be made to minimize any additional inductance that is introduced. Accordingly, with the ground probe 20 shown in FIG. 1, connection 18 is made near the end of the tip 14, closest to the point of ground. Although other types of connections having a low self-inductance quality might be employed without departing from the principles of the invention, a preferred connector having that quality is described herein.

FIG. 2 shows the strand 10 connected to the ground probe 20 by the connection 18 as in FIG. 1, and also shows the other end of the strand 10 connected to a signal probe 22 by a connection 24. The signal probe 22 typically comprises an insulated handle 26 covering a coaxial shaft having an outer cylindrical conductor 28 and an inner conductor 30 which is used for making high frequency measurements. The ground lead is needed to connect the outer conductor, which is the ground of the input to the measurement instrument, to the ground of the circuit to be measured. Preferably, to achieve the advantages of the invention the ground lead should have a maximum self-inductance of about 20 nanohenries per inch. The connection 24 is also a substantially noninductive connection positioned at the signal-acquiring end of the signal probe 22 so as to substantially bypass any self-inductance of the signal probe. The advantages of the invention become most evident as frequencies of the signal source approach and exceed 100 megahertz, at which point the typical resonant frequency of a conventional ground lead and signal probe combination is reached.

FIG. 3 shows a cross-section of a preferred embodiment of strand 10. It is a single, monolithic strand having a substantially rectangular cross-section, which provides a relatively large surface area for a given cross-sectional area and flexibility in the thin dimension, which eliminates induction caused by one or more current carrying strands being twisted or coiled with respect to each other as is found in the braided wire commonly used in conventional ground leads. However, the invention also contemplates the use of more than one strand, as long as such strands are not twisted or coiled with respect to each other. The flexibility of the strand 10 makes it much more useful in making actual measurements of signals than inflexible wire or wires which, though they may bend, become work-hardened and fail. A strand made of thin metal foil, such as copper foil 0.25 inches wide and 0.003 inches thick, is a preferred kind of flexible strand which provides sufficient surface area for a given cross-sectional area to adequately minimize the self-inductance of the strand. However, it is recognized that other geometries and materials having the same qualities might be employed without departing from the principles of the invention.

FIG. 4 shows one form of connector 32 for attaching the strand 10 to the ground probe 20. The connector 32 is made of a conductive material, such as brass, copper or gold, and flaps 34 which are crimped onto the strand 10, thereby substantially eliminating the introduction of additional inductance caused by the connector. This is in contrast to the prior art which accomplishes the connection to a probe by coiling the end of a wire to the tip of the probe. A sleeve 36 of the connector 32 may be shaped to conform to the end of a ground probe, such as probe 20 shown in FIG. 1, the tip of which is inserted into sleeve 36, so as to maximize the contact with the ground probe and to minimize any inductance resulting from such connection.

FIG. 5 shows a connector 38 for connecting a strand 10 to a signal probe, such as probe 22 shown in FIG. 2. The connector 38 shown in FIG. 5 is similar in construction and operation to the connector 32 shown in FIG. 4. That is, it has conductive flaps 40 crimping the connector 38 to the strand 10 and a sleeve 42 into which a signal probe will be inserted. The sleeve 42 may also be shaped to conform to the end of the signal probe which will be inserted into such sleeve, so as to maximize the contact and reduce the induction in making the connection.

The ground lead can be altered in various ways within the basic concept of this invention. In particular, the connection 14 may be made so as to attach to ground directly, without the use of a separate ground probe.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention, is defined and limited only by the claims which follow.

What is claimed is:

1. High frequency electrical signal measurement probe apparatus, comprising
   a signal probe having a signal input tip and a ground conductor adjacent said input tip,
   a ground probe having a conductive grounding tip and an adjacent ground conductor, and
   a low inductance ground lead interconnecting the ground conductors of said signal probe and ground probe, said ground lead comprising a monolithic, flexible strand of conductive foil having a maximum self inductance of about 20 nanohenries per inch.

2. The probe apparatus of claim 1, wherein said ground lead includes means at the opposite ends thereof for removably connecting said lead to said signal and ground probes.

3. The probe apparatus of claim 1, wherein said ground lead includes a single strand of said conductive foil.

4. The probe apparatus of claim 1, wherein said ground lead includes two or more strands of said foil, each having a maximum self-inductance of about 20 nanohenries per inch.

* * * * *